(12) United States Patent
Ellis-Monaghan et al.

(10) Patent No.: US 8,440,519 B2
(45) Date of Patent: May 14, 2013

(54) SEMICONDUCTOR STRUCTURES USING REPLACEMENT GATE AND METHODS OF MANUFACTURE

(75) Inventors: John J. Ellis-Monaghan, Grand Isle, VT (US); Jeffrey P. Gambino, Westford, VT (US); Kirk D. Peterson, Jericho, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 12/778,319

(22) Filed: May 12, 2010

(65) Prior Publication Data

US 2011/0281409 A1    Nov. 17, 2011

(51) Int. Cl.
*H01L 21/8238* (2006.01)
(52) U.S. Cl.
USPC ..... 438/199; 438/232; 438/305; 257/E21.405
(58) Field of Classification Search ............... 438/199, 438/299–305, 229–232; 257/E21.435
See application file for complete search history.

(56) References Cited

U.S. PATENT DOCUMENTS

| | | | |
|---|---|---|---|
| 6,274,450 B1 * | 8/2001 | Lin et al. | 438/305 |
| 6,297,117 B1 * | 10/2001 | Yu | 438/305 |
| 6,908,850 B2 | 6/2005 | Doris et al. | |
| 6,949,796 B1 | 9/2005 | Ellis-Monaghan et al. | |
| 7,041,538 B2 | 5/2006 | Ieong et al. | |
| 7,138,308 B2 | 11/2006 | Cheng et al. | |
| 2005/0048732 A1 | 3/2005 | Park et al. | |
| 2005/0148134 A1 * | 7/2005 | Dokumaci et al. | 438/199 |
| 2006/0128055 A1 * | 6/2006 | Cheng et al. | 438/83 |
| 2009/0087974 A1 | 4/2009 | Waite et al. | |
| 2009/0186457 A1 | 7/2009 | Lee et al. | |

OTHER PUBLICATIONS

A. Bhattacharyya et al., "Method to Minimize Junction Added by a Punch-Through Implant", IP.com Prior Art Database, Jan. 1, 1990, pp. 312-313.
A. Acovic et al., "Self-Aligned Pocket Implantation Technology for . . . Deposition", IP.com Prior Art Database, May 1, 1993, pp. 233-236.
H. C. Srinivasaiah et al., "Mixed-Mode Simulation Approach to . . . Variations", IEEE, vol. 22, No. 6, Jun. 2003, pp. 742-747.
W. K. Yeh et al., "Efficient Transition Optimization with . . . CMOSFET", IEEE 2007, pp. 67-70.

* cited by examiner

*Primary Examiner* — Thanhha Pham
(74) *Attorney, Agent, or Firm* — David Cain; Roberts Mlotkowski Safran & Cole, P.C.

(57) ABSTRACT

An improved semiconductor device manufactured using, for example, replacement gate technologies. The method includes forming a dummy gate structure having a gate stack and spacers. The method further includes forming a dielectric material adjacent to the dummy gate structure. The method further includes removing the spacers to form gaps, and implanting a halo extension through the gaps and into an underlying diffusion region.

13 Claims, 6 Drawing Sheets

SEMICONDUCTOR STRUCTURES USING REPLACEMENT GATE AND METHODS OF MANUFACTURE

FIELD OF THE INVENTION

The invention relates to a semiconductor structures and methods of manufacture and, more particularly, to improved semiconductor structures using replacement gate technologies and methods of manufacture.

BACKGROUND

The fabrication processes of a semiconductor transistor are very complex processes ranging from deposition and growing of certain materials, to etching or removing certain materials, to implanting dopants at or near the source and drain regions. In the latter fabrication process, halo implantation can be provided which is a fabrication step that involves the doping of regions beneath the doped source and drain regions of the transistor so as to form halo regions. For each of such halo regions, only the portion under the gate region (called undercutting portion) is useful, and therefore desirable; whereas, the rest of the halo region has the effect of reducing the doping concentration of the respective source and drain regions, which is undesirable.

In fact, it is known that the halo regions can increase the resistance of the device, which impairs the device performance. For example, halo implants are used in CMOS fabrication to suppress punch-through effect. The halo implants are typically low energy, low current implantation processes carried out at large incident angle so that implanted dopants penetrate underneath the edge of the MOS gate stack. However, when strong halo doping is employed, there is a significant increase in junction leakage current. For many implementations, this implant also significantly increases the parasitic junction capacitance, reducing the inherent speed of the device. Also, the sheet resistance can be significantly increased, which can result in device impairment. The sheet resistance is a measure of resistance of thin films that have a uniform thickness. It is commonly used to characterize materials made by semiconductor doping, and metal deposition processes.

Accordingly, there exists a need in the art to overcome the deficiencies and limitations described hereinabove.

SUMMARY

In a first aspect of the invention, a method comprises foil ring a dummy gate structure having a gate stack and spacers. The method further includes forming a dielectric material adjacent to the dummy gate structure. The method further includes removing the spacers to form gaps, and implanting a halo extension through the gaps and into an underlying diffusion region.

In another aspect of the invention, a method comprises forming at least one gate structure with spacers on a diffusion region formed on an underlying substrate. The method further includes forming gaps to expose the diffusion region by removing the spacers. The method further includes implanting a dopant through the gaps into an underlying diffusion region.

In yet another aspect of the invention, a structure comprises: a substrate having a diffusion region and a gate structure formed thereon with source and drain regions; and a halo implant provided in the diffusion region immediately adjacent to the gate structure and bordering the source and drain region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the coplanar waveguide structure (CPW), which comprises the structures of the present invention. In still further embodiments, a method in a computer-aided design system is provided for generating a functional design model of the CPW. The method comprises generating a functional representation of the structural elements of the CPW.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to improved semiconductor devices manufactured using, for example, replacement gate technologies. Advantageously, the present invention limits a concentration of the halo implant under the source and drain regions of the device which, in turn, improves device Rc. More specifically, using the processes of the invention, halos are confined under an area immediately adjacent to a gate structure (and are not present in the source and drain regions). The halo implants are confined to such regions by using, for example, disposable spacers to create a small gap for the halo implants. In embodiments, Xe, for example, can be implanted into this same gap to create localized voids that can induce a stress on the device which, in turn, improves hole mobility and hence device performance. The stress voids can be created with, for example, Xe or other types of implants and subsequent anneal.

Figure 1:
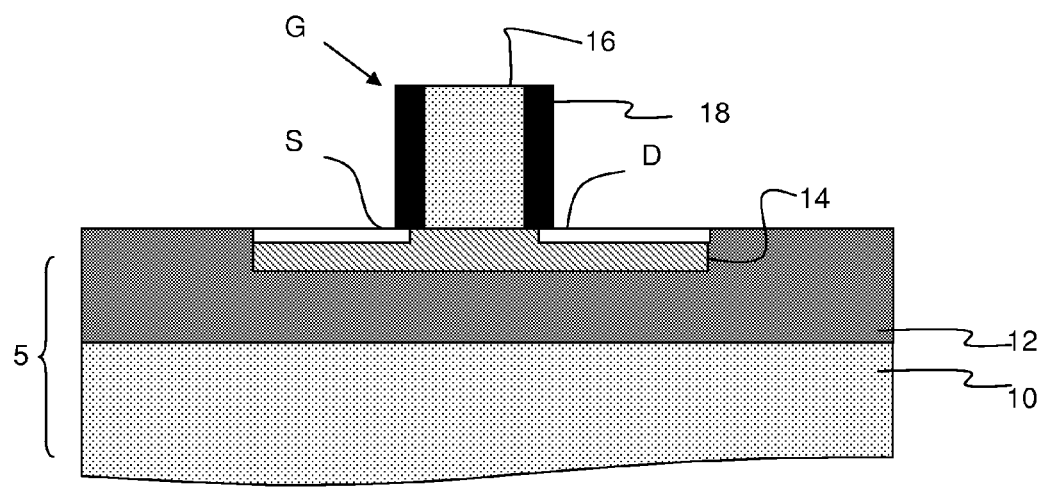
FIGS. 1-5 shows structures and related processing steps in accordance with aspects of the invention.

FIG. 1 shows a beginning structure in accordance with aspects of the invention. More specifically, FIG. 1 shows a substrate generally shown at reference numeral 5. The substrate 5 can include, for example, SOI or other conventional substrates such as BULK. In embodiments, the substrate 5 includes an oxide layer 12 which is grown or deposited on an Si wafer 10. A diffusion region 14 is formed using conventional processes. For example, the substrate 5 can be patterned using conventional lithographic and etching processes to define the diffusion region 14.

Still referring to FIG. 1, a temporary (e.g., dummy) gate structure "G" is formed on the diffusion region 12. The dummy gate structure "G" includes, for example, a gate stack 16 and spacers 18. More specifically, the gate stack 16 can include a gate dielectric comprising oxide or other insulator materials such as HfO$_2$ or other high-K dielectric material, deposited on the diffusion region 12. A poly or nitride material can be deposited on the gate dielectric material. In embodiments, the gate stack 16 can also be a metal or any sacrificial material, as the dummy gate structure "G" will be etched away during a later processing step and replaced with a permanent gate structure.

In embodiments, the spacers 18 are made of a different material than used to fabricate the gate stack 16. For example, the spacers 18 can be made from a nitride material and the gate stack 16 can be made of a poly material. This will permit selective etching of the gate stack 16 and/or spacers 18 in subsequent processing steps.

In embodiments, the spacers 18 are deposited on the sides of the gate stack 16 using conventional deposition processes. For example, the spacers 18 (as shown in FIG. 1) may be deposited in two deposition processes in order to accommodate the implantation of the extensions and source/drain regions (generally shown as "S" and "D"). Illustratively, after a first portion of the spacers 18 is deposited to a certain thickness, using a conventional deposition process, extension regions are implanted on the sides of the dummy gate structures "G". Thereafter, the remaining portions of the spacers 18 are deposited to a final thickness, after which the source and drain regions are implanted using conventional dopants.

In embodiments, the thickness of the spacers 18 can range from about 20 Å to 5000 Å; although it should be understood by those of skill in the art that the spacers 18 can be of different thicknesses. For example, the spacers 18 can have any aspect ratio that, when removed, constrains halo implantation in later processing. In one illustrative and non-limiting example, the dummy gate structure "G" can have a thickness of about 600 Å, the underlying silicon diffusion 14 can be about 400 Å and the spacers 18 can have a thickness of about 100 Å to about 200 Å. The gate may have a thickness in the range of 100 Å to about 5000 Å.

In embodiments, the source "S" and drain "D" regions can be activated using a conventional annealing process. In embodiments, the source "S" and drain "D" regions can alternatively be activated after halo implantation. In further embodiments, a silicide can be formed on the structure by a deposition of a metal, e.g., nickel, and an anneal process. The nickel and anneal process will form, for example, a nickel silicide. Any unreacted nickel (or other metal) will be cleaned using conventional cleaning processes.

Figure 2:
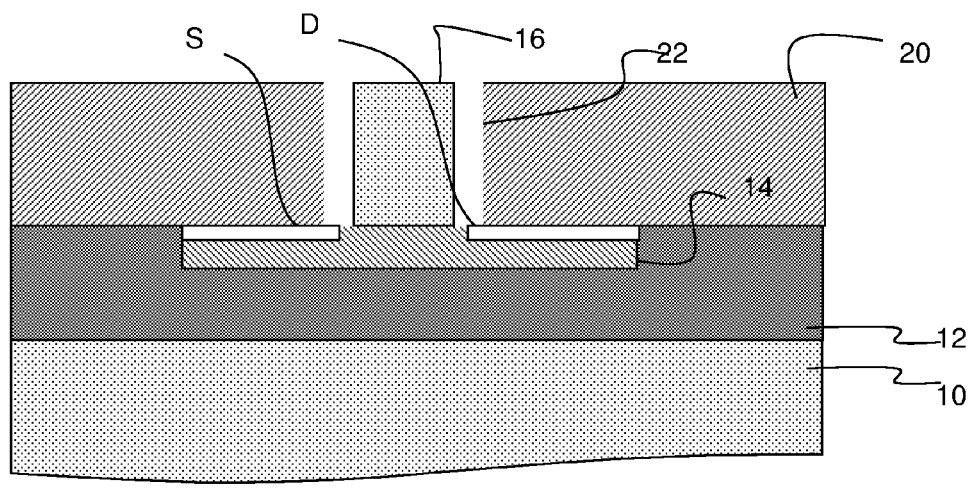

FIG. 2 shows additional processing steps and respective structures in accordance with aspects of the invention. In FIG. 2, a dielectric material 20 is deposited on the structure of FIG. 1. The dielectric material 20 may be, for example, an oxide. In embodiments, the dielectric material 20 should be a different material than the spacers 18 and the dummy gate structure "G". This will permit selective etching of the dummy gate structure "G" and/or spacers 18 in subsequent processing steps. The dielectric material 20 can be polished using, for example, a chemical mechanical polish (CMP). In embodiments, the dielectric material 20 is in direct physical contact with the spacers 18.

Gaps 20 are formed on the side of dummy gate structures "G" by removing the spacers. The spacers can be removed by a conventional reactive ion etching (RIE) process or a chemical etch. As shown in FIG. 2, the gaps 20 are aligned with the edges of the FET channel. In embodiments, the gaps 20 can range from about 100 Å to about 1000 Å and more preferably about 200 Å to about 300 Å; although other dimensions are also contemplated by the invention depending on the thickness of the spacers.

Figure 3:
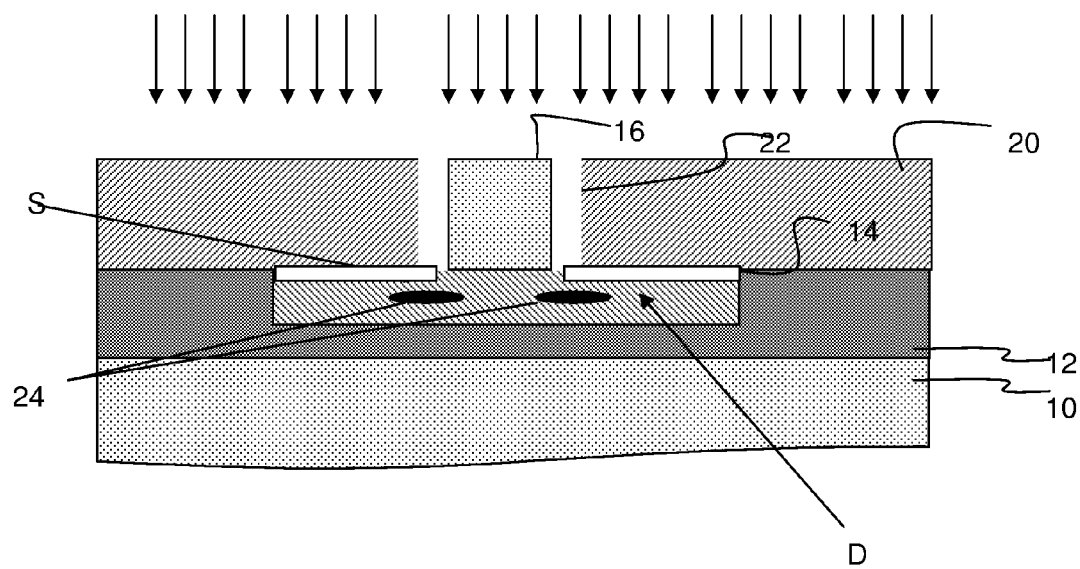

In FIG. 3, halos 24 are implanted into the diffusion regions below the source "S" and drain "D" regions at the edge of the channel. In embodiments, the halos 24 are implanted through the gaps 20, which create sharper junctions at the edges of the source "S" and drain "D" regions. In this way, the halo implants 24 are provided in the diffusion regions 14, below the source "S" and drain "D" regions, at a lower dosage than conventional methodologies. For example, the halo implants may be at depth of 20 Å-5000 Å in the diffusion regions 14. The lower dosage halo implants 24 will improve device Rc. In embodiments, the implanting is an opposite doping type material to the diffusion regions in an underlying silicon layer for a halo material and a same doping material as the diffusion regions for an extension material.

The halo implants can be a P+ type dopant (e.g., boron, indium) for an NFET or an N+ dopant (e.g., phosphorous, arsenic, antimony) for a PFET. In embodiments that have structures with both NFET and PFET devices, a masking step can be used to mask one of the FET types while implanting halos for another of the FET types. For example, NFET devices can be doped with phosphorous, while the PFET devices are protected with a mask. After removal of the mask on the PFET devices, the NFET devices can then be masked while halos are implanted in the PFET devices. In any of the embodiments, the halo implant 24 is provided in the diffusion region 14 immediately adjacent to the gate structure and adjoining the source "S" and drain "D" regions such that the halo implant 24 is forming a sharper junction with the source "S" and drain "D" regions.

The halo implants are also implanted into the dielectric material 20 and the dummy gate structure "G". However, such implantation has no discernable effect on the device. This is because, for example, the dummy gate structure "G" will be removed in later processing steps and, as should be known to those of skill in the art, the dielectric material 20 is not electrically active (and hence the halo implants will not have any discernable effects on such material). In embodiments, the halo implants 24 can undergo an annealing process to become electrically active.

Figure 4:
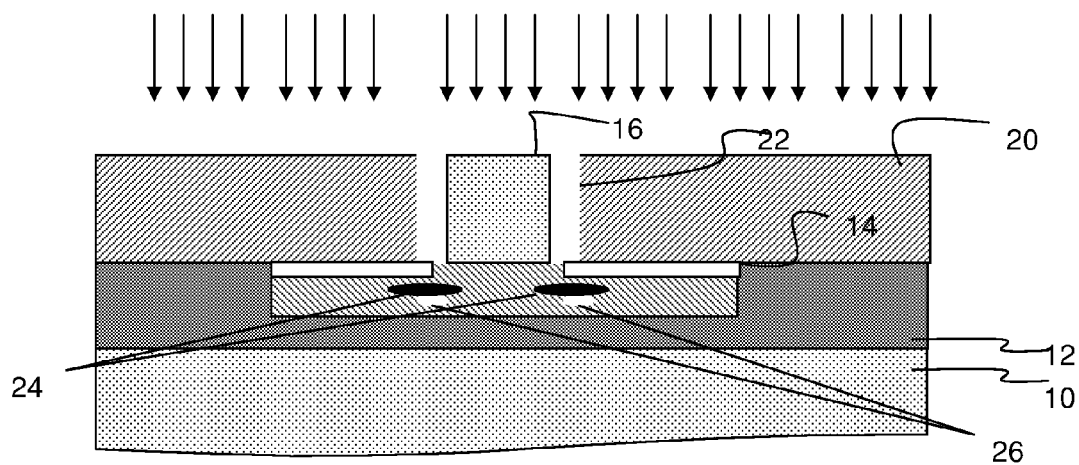

FIG. 4 shows optional processing steps in accordance with aspects of the invention. In this embodiment, Xe, for example, is implanted through the gaps 20. The structure then undergoes an annealing process to form the voids 26 in the diffusion region 12, preferably below the halo implants 24. The voids 26 provide a stress component under the device to enhance device performance. For example, the voids can create a compressive force to enhance PFET performance. In embodiments, other species such as, for example, Neon, Argon, Helium, Krypton, and Hydrogen, can be used to create voids 26. Germanium or Oxygen can be used to create silicon compounds that would also increase the stress after an annealing process, which can equally be represented at reference numeral 26. In embodiments, the annealing process for forming the voids can be performed to activate the source "S" and drain "D" regions and halo implants 24. To this end, it should be understood that the annealing process for the source "S" and drain "D" regions and halo implants 24 can occur at different times or the same time in the process.

Figure 5:
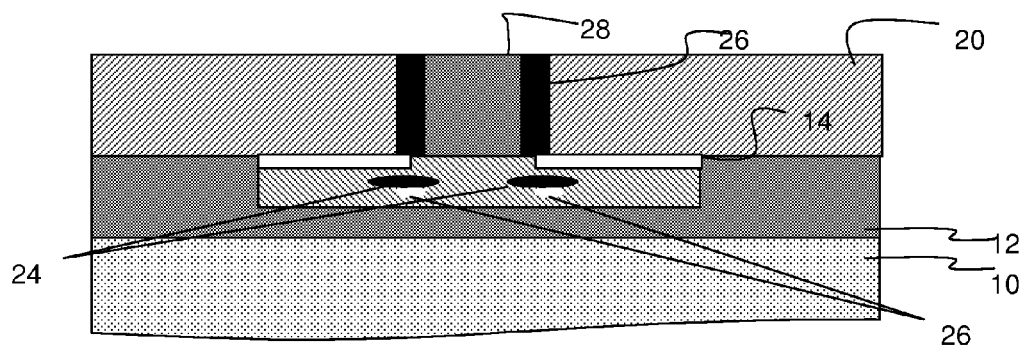

FIG. 5 shows additional processing steps and a resulting structure in accordance with aspects of the invention. In FIG. 5, the gaps are filled with a material such as, for example, nitride, to form permanent spacers 26. The material is then polished back to expose the dummy gate structure "G". The removal of spacer material over the dummy gate structure can be performed by a CMP process or a directional RIE, for example. Once the dummy gate structure is exposed, it can then be selectively removed (e.g., selective to the spacers 26 and dielectric material 20) by a RIE or any known chemistry removal process, to form an opening between the spacers 26. In embodiments, the underlying dielectric layer may also be removed during the RIE or chemistry process and then a permanent dialectric material deposited. After the dummy gate structure "G" is removed, a permanent gate structure 28 is deposited in the opening using conventional gate formation processes. The gate structure 28 can be, for example, a poly gate or a metal gate, formed in conventional deposition or sputtering processes, respectively. The gate material 28 can then be polished or etched back in accordance with known processes.

Figure 6:
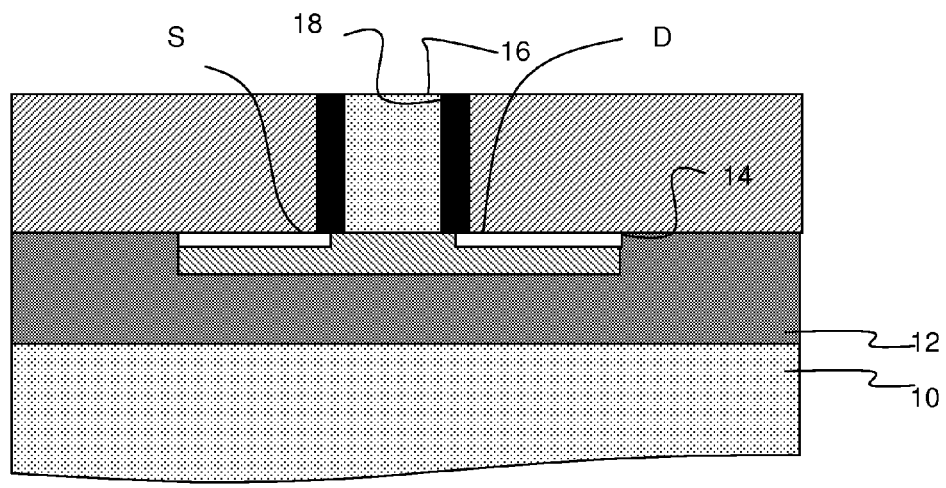
FIGS. 6-9 shows structures and related processing steps in accordance with additional aspects of the invention.

FIGS. 6-9 show alternative structures and related processing steps in accordance with additional aspects of the invention. FIG. 6 shows a substrate generally shown at reference numeral 5. The substrate 5 can include, for example, SOI or other conventional substrates such as BULK. For example, in embodiments, the substrate 5 includes an oxide layer 12 grown or deposited on the Si wafer 10. A diffusion region 14 is formed in the oxide layer 12 using conventional processes, as discussed with reference to FIG. 1.

Still referring to FIG. 6, a temporary (e.g., dummy) gate structure "G" is formed on the diffusion region 12. The dummy gate structure "G" includes, for example, a gate stack 16 and spacers 18. More specifically, the gate stack 16 can include a gate dielectric comprising an oxide or other insulator materials such as $HfO_2$ or other high-K dielectric material, deposited on the diffusion region 12. A poly, nitride material, metal or other sacrificial material can be deposited on the gate dielectric material to form the gate stack 16. In embodiments, the spacers 18 are made of a different material than used to fabricate the gate stack 16 for reasons discussed above. In embodiments, the spacers 18 are deposited on the sides of the gate stack 16 using conventional deposition processes in the manner discussed with reference to FIG. 1. Extensions and source "S" and drain "D" regions are also formed in the structure.

In embodiments, the source "S" and drain "D" regions can be activated using a conventional annealing process. In embodiments, the source "S" and drain "D" regions can alternatively be activated after subsequent halo implantation. In further embodiments, a silicide can be formed on the structure by a deposition of a metal, e.g., nickel, and an anneal process. The nickel and anneal process will form, for example, a nickel silicide. Any unreacted nickel will be cleaned using conventional cleaning processes.

Figure 7:
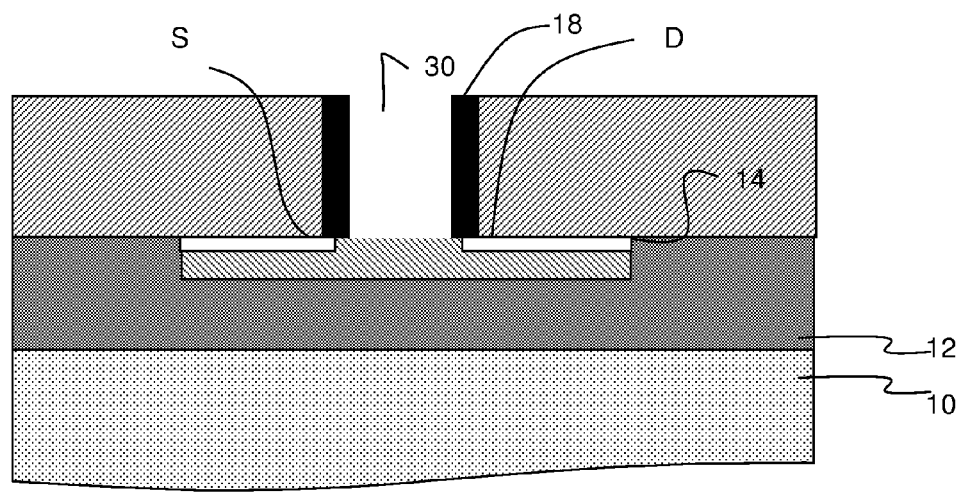

FIG. 7 shows additional processing steps and respective structures in accordance with aspects of the invention. In FIG. 7, a dielectric material 20 is deposited on the structure of FIG. 1. The dielectric material 20 may be, for example, an oxide. In embodiments, the dielectric material 20 should be different from the spacers 18 and the gate stack 16. This will permit selective etching of the gate stack 16 and/or spacers 18 in subsequent processing steps. The dielectric material 20 can be polished using, for example, a chemical mechanical polish (CMP). The gate stack 16 is removed to form an opening 30. In embodiments, the dielectric material 20 is in direct physical contact with the spacers 18.

Figure 8:
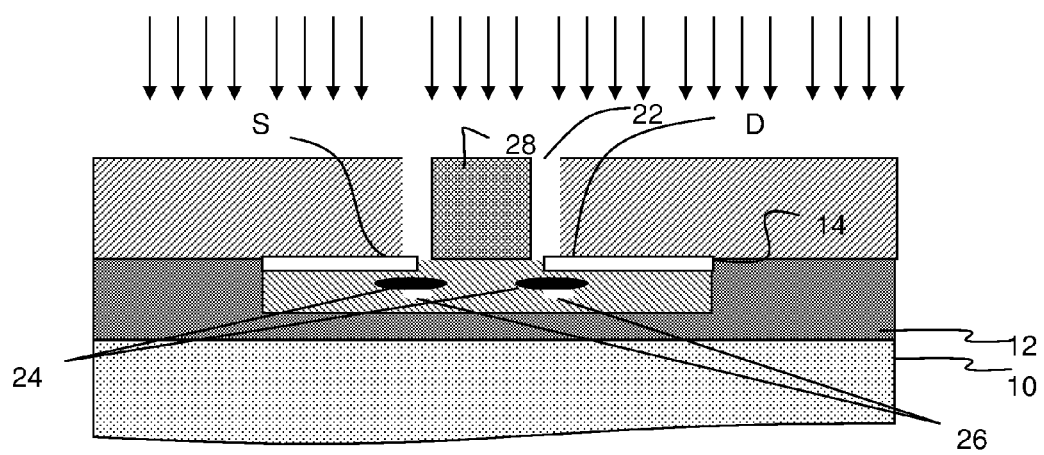

In FIG. 8, a permanent gate structure 28 is deposited in the opening. The gate structure 28 can be, for example, a poly gate or a metal gate, formed in conventional deposition or sputtering processes, respectively. The material of the permanent gate structure 28 can then be polished or etched back in accordance with known processes. Gaps 22 are formed on the side of the gate structure 28 by removing the spacers. The spacers can be removed by a conventional reactive ion etching (RIE) process or a chemical etch. As shown in the figure, the gaps 22 are aligned with edges of the device channel and the source "S" and drain "D" regions. In embodiments, the gaps 22 can range from about 100 Å to about 1000 Å and more preferably about 200 Å to about 300 Å; although other dimensions are also contemplated by the invention.

In FIG. 8, the halos 24 are implanted into the regions between the FET channel and the source "S" and drain "D" regions. In embodiments, the halos 24 are implanted through the gaps 22, which limit the dosage at the source "S" and drain "D" regions. In this way, the halo implants 24 are provided in the diffusion regions 14, below the source "S" and drain "D" regions, at a lower dosage than conventional methodologies. The lower dosage halo implants 24 will improve device Rc.

The halo implants can be a P+ type dopant (e.g., boron, indium) for an NFET or an N+ dopant (e.g., arsenic, phosphorous, antimony) for a PFET. As such, in embodiments that have structures with both NFET and PFET devices, a masking step can be used to mask one of the FET types while implanting another of the FET types. For example, NFET halos can be doped with an arsenic, while the PFET devices are protected. After removal of the mask on the PFET devices, the NFET devices can then be masked while halos are implanted in the PFET devices. The halo implants are also implanted into the dielectric material 20 and the dummy gate structure "G". The halo implant 24 is provided in the diffusion region 14 immediately adjacent to the gate structure and bordering the source "S" and drain "D" regions.

FIG. 8 also shows optional processing steps in accordance with aspects of the invention. In this embodiment, Xe, for example, is implanted through the gaps 22. The structure then undergoes an annealing process to form the voids 26. The voids 26 provide a stress component under the device to enhance device performance. For example, the voids can create a compressive force to enhance PFET performance. In embodiments, other species such as, for example, Neon, Argon, Helium, Krypton, and Hydrogen, can be used to create the voids 26. Germanium or Oxygen can be used to create silicon compounds that would also increase the stress.

In embodiments, the annealing process for forming the voids can be the same anneal used to activate the source "S" and drain "D" regions and halo implants 24. To this end, it should be understood that the annealing process for the source "S" and drain "D" regions and halo implants 24 can occur at different times or the same times in the process.

Figure 9:
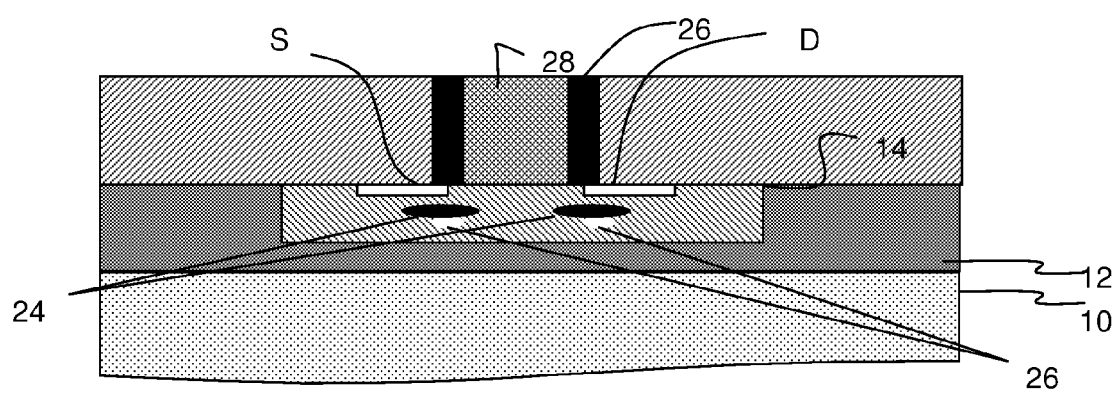

FIG. 9 shows additional processing steps and a resulting structure in accordance with aspects of the invention. In FIG. 9, the gaps are filled with a material such as, for example, nitride, to form permanent spacers 26. The material is then optionally polished or etched back to expose the gate structure 28. The optional removal of this extra spacer material can be performed by a CMP process or a directional RIE, for example.

Figure 10:
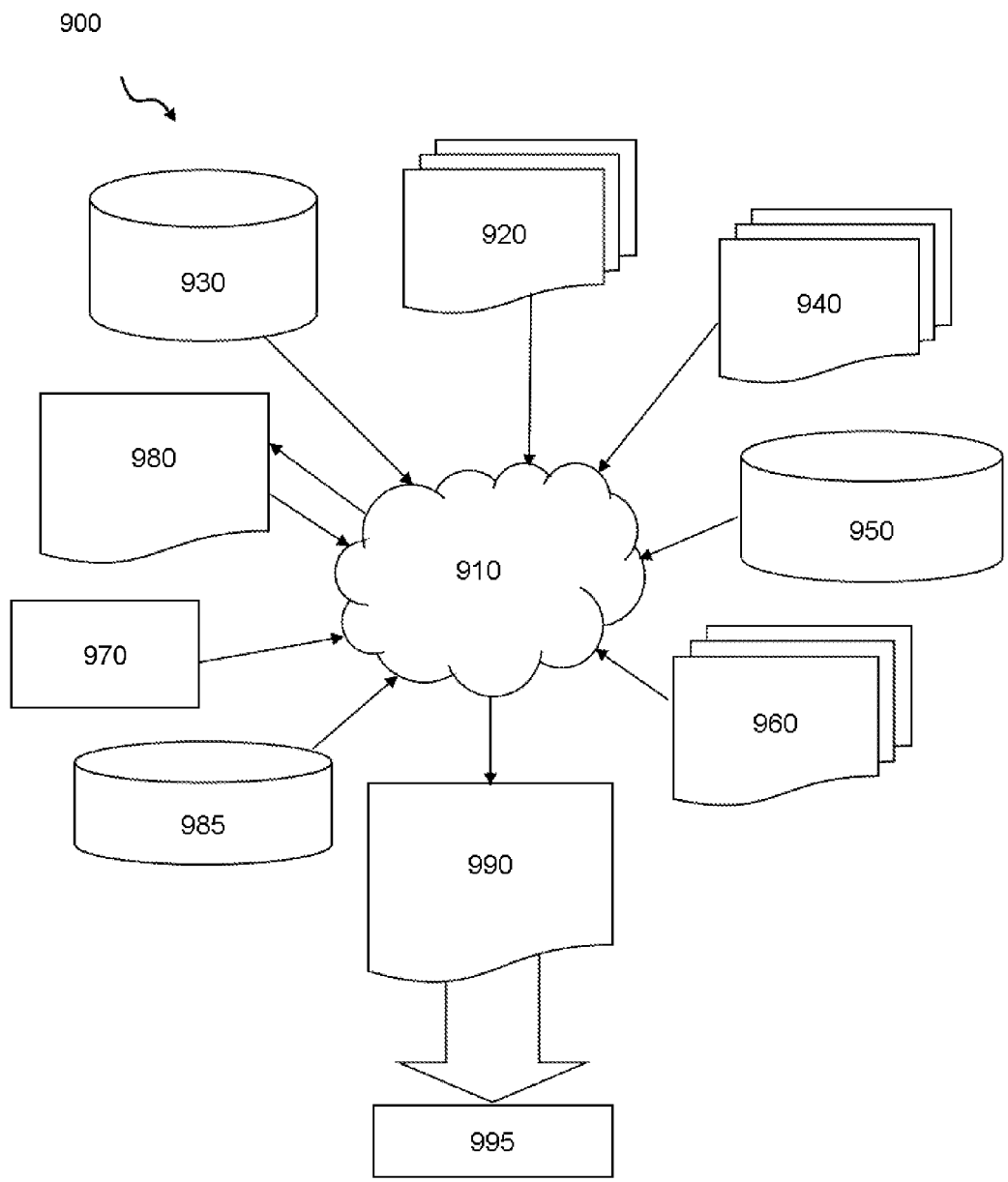
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a dummy gate structure having a gate stack and spacers;
   forming a dielectric material adjacent to the dummy gate structure;
   removing the spacers to form gaps;
   implanting a material through the gaps and into an underlying silicon region for device tailoring;
   after the implanting the material through the gaps, forming permanent spacers in the gaps;
   after the forming the permanent spacers in the gaps, removing the gate stack and forming a permanent gate structure by replacing the gate stack with a permanent gate stack.

2. The method of claim 1, wherein the gaps are provided between the gate stack of the dummy gate structure and the dielectric material.

3. The method of claim 1, wherein the dielectric material is formed in direct physical contact with the spacers.

4. The method of claim 1, wherein the spacers, the dielectric material and the gate stack are formed of different materials.

5. The method of claim 4, wherein the spacers are removed using a selective etching process.

6. The method of claim 1, wherein the implanting forms a halo below source and drain regions in the underlying silicon region.

7. The method of claim 1, wherein the implanted material is an opposite doping type material to diffusion regions in an underlying silicon layer for a halo material and a same doping material as the diffusion regions for an extension material.

8. The method of claim 7, further comprising forming voids in the diffusion regions, wherein the forming the voids includes implanting one of Neon, Argon, Helium, Krypton, Hydrogen and Xe through the gaps and performing an anneal.

9. The method of claim 1, further comprising implanting germanium or oxygen through the gaps and performing an anneal to increase a stress component.

10. The method of claim 1, wherein the removing the gate stack comprises removing a gate dielectric material of the gate stack; and, wherein the forming the permanent gate structure includes forming a gate dielectric layer on the diffusion region which forms part of the permanent gate structure.

11. The method of claim 1, further comprising:
    forming voids in diffusion regions, wherein the forming the voids includes implanting one of Neon, Argon, Helium, Krypton, Hydrogen and Xe through the gaps and performing an anneal; and
    wherein the forming the permanent spacers comprises forming the permanent spacers comprising nitride nitride,
    wherein the anneal is performed to activate source and drain regions and the implanted material.

12. A method comprising:
    forming at least one temporary gate structure with spacers on a diffusion region formed on an underlying substrate;
    forming gaps to expose the diffusion region by removing the spacers;
    implanting a dopant through the gaps into an underlying diffusion region;
    after the implanting the dopant through the gaps, forming permanent spacers in the gaps;
    after the forming the permanent spacers in the gaps, removing a gate stack of the at least one temporary gate structure and replacing the gate stack with a permanent gate stack.

13. The method of claim 12, wherein:
    the at least one temporary gate structure is at least two gate structures,
    a first of the gate structures is a PFET and a second of the gate structures is an NFET, and
    the implanting a dopant through the gaps includes:
      masking one of the PFET and NFET during the implanting of a respective one of the NFET and PFET; and
      after the implanting, removing the mask and forming another mask on the at least one gate structure that was implanted and implanting the other of the at least one gate structure.

* * * * *